United States Patent [19]
Canham et al.

[11] Patent Number: 5,212,101
[45] Date of Patent: May 18, 1993

[54] SUBSTITUTIONAL CARBON IN SILICON

[75] Inventors: Leigh T. Canham; Keith G. Barraclough, both of Worcestershire; Mark R. Dyball, Birkenshaw, all of England

[73] Assignee: Secretary of State for Defence in her Britannic Majesty's Government of the United Kingdom, London, England

[21] Appl. No.: 772,367

[22] PCT Filed: Apr. 11, 1990

[86] PCT No.: PCT/GB90/00553
§ 371 Date: Nov. 6, 1991
§ 102(e) Date: Nov. 6, 1991

[87] PCT Pub. No.: WO90/13138
PCT Pub. Date: Nov. 1, 1990

[30] Foreign Application Priority Data
Apr. 14, 1989 [GB] United Kingdom ............. 8908509

[51] Int. Cl.$^5$ ..................................... H01K 21/265
[52] U.S. Cl. ................................. 437/24; 437/27; 437/905; 437/247; 148/DIG. 4; 148/DIG. 155
[58] Field of Search ............... 437/24, 27, 905, 933, 437/247; 148/DIG. 99, DIG. 3, DIG. 4, DIG. 155, DIG. 76, DIG. 82, DIG. 83, DIG. 84

[56] References Cited
U.S. PATENT DOCUMENTS
3,622,382 11/1971 Brack et al. ................. 437/24
4,891,332 1/1990 Bloem et al. ................. 437/24

FOREIGN PATENT DOCUMENTS
220812 4/1985 Fed. Rep. of Germany ........ 437/24
220814 4/1985 Fed. Rep. of Germany ........ 437/24
56-105652 8/1981 Japan ..................................... 437/24
58-46617 3/1983 Japan ..................................... 437/24
WO86/03334 6/1986 PCT Int'l Appl. .
WO88/09060 11/1988 PCT Int'l Appl. .

OTHER PUBLICATIONS
Wolf, S., et al., *Silicon Processing for the VLSI Era, vol. 1: Process Technology*, ©1986 pp. 303-308.
Journal of Applied Physics, vol. 58, No. 12, "Ion Implantation of Si . . . ," Wang et al., pp. 4553-4564 (Dec. 15, 1985).
Thin Solid Films, vol. 163, No. 1+index, "High-dose carbon ion implantation studies in silicon," Srikanth et al., pp. 323-329 (Sep. 1988).
Japanese Journal of Applied Physics, vol. 24, No. 10, "The Raman spectrum of carbon in silicon," Forman et al., pp. L848-L850, L848, right-hand column, paragraph 2 (Oct. 1985).

*Primary Examiner*—George Fourson
*Attorney, Agent, or Firm*—Nixon & Vanderhye

[57] ABSTRACT

The invention provides a method of producing silicon with about 100% substitutionality of very high concentrations of carbon up to about $10^{21}$ cm$^{-3}$, which has good quality recrystallized layers containing low levels of residual damage, and which avoids precipitation of mobile carbon. This method, compatible with current state-of-the-art VLSI silicon technology, comprises the sequential steps of: implanting a silicon wafer with carbon ions, and two step annealing of the implanted silicon wafer.

15 Claims, 10 Drawing Sheets

SUBSTITUTIONAL CARBON IN SILICON

This invention relates to a method of incorporating substitutional carbon in silicon, and more specifically to incorporating very high concentrations of substitutional carbon by a method compatible with microcircuit fabrication.

Substitutional carbon, when present within a luminescent complex such as the $C_S$—$Si_I$—$C_S$ (where $C_S$=a substitutional carbon atom and $Si_I$=a interstitial silicon atom) centre has been shown to greatly enhance the efficiency of silicon light emitting diodes (LEDs) (patent application number 8711373). Dopants such as carbon are needed to obtain relatively efficient luminescence from silicon, an indirect band gap material. The incorporation of substitutional carbon at concentrations of about $10^{18}$ atoms cm$^{-3}$ gives rise to an increase of 3 orders of magnitude in silicon luminescence.

Under equilibrium conditions an isolated carbon atom resides on a substitutional site within the silicon lattice. The equilibrium solubility of carbon in Float Zone (FZ) silicon varies with temperature, reaching a maximum of $\sim 3 \times 10^{17}$ cm$^{-3}$ at the melting point of silicon (1415° C.), whilst the solubility of carbon in liquid silicon is $\sim 5 \times 10^{18}$ cm$^{-3}$. (K G Barraclough in 'Properties in Silicon' Chapter 12, pp 285-8, 296-8, 304-6 (1988) Inspec).

To incorporate higher levels of carbon in silicon and avoid precipitation requires introduction of the impurity under conditions far removed from equilibrium. It is widely known that the maximum equilibrium solubility of substitutional impurities in silicon can be greatly exceeded by ion implantation with subsequent removal of damage by annealing. Two very different annealing techniques have proved successful in this regard:

(a) solid phase recrystallisation (SPEG) by low temperature furnace annealing (J S Williams, R G Elliman, Nuclear Instrumental Methods, 182/3 p389 1981)

(b) Liquid phase recrystallization (LPEG) using pulsed lasers to melt the damaged layer (C W White, B R Appleton, S R Wilson in 'Laser Annealing of Semiconductors' Chapter 5 pp112-145, 1982).

As recrystallisation occurs, both SPEG and LPEG can be characterised by a planar interface (separating the crystal-amorphous or the crystal-liquid phases respectively) moving towards the surface. In the case of SPEG the interface velocity can be made very low (e.g. $\sim 1$ Å s$^{-1}$ at 550° C.) whilst for LPEG, extremely high (e.g. 100 cm s$^{-1}$). However, in both cases supersaturation of an impurity in the recrystallised layer relies on the same mechanism, namely solute trapping at the moving interface when the residence time is larger than the one monolayer regrowth time (S U Campisano et al, Applied Physics Letters 37 p719 1980). This mechanism is generally found to be effective for slowly diffusing substitutional impurities, but ineffective for fast interstitial diffusers.

Although a vast amount of information exists for electrically active substitutional dopants such as boron, indium, phosphorus, arsenic and antimony, very little is known about the behaviour of ion implanted carbon in silicon.

However, one extremely important characteristic of the behaviour of carbon in silicon at non-equilibrium conditions, which is known, is that the substitutional impurity can be rendered interstitial by the well-established Watkins' replacement mechanism (G D Watkins in 'Radiation Damage in Semiconductors' (Paris:Dunod) pp 97-113 1965):

$$Si_I + C_S \rightarrow C_I \quad (1)$$

where $Si_I$ is an interstitial silicon atom, $C_S$ is a substitutional carbon atom and $C_I$ is an interstitial carbon atom. Interstitial carbon is considerably more mobile than substitutional carbon e.g. the diffusion coefficient of interstitial carbon $\sim 10$ orders of magnitude larger than substitutional carbon at $\simeq 750°$ C. Extrapolation of diffusion data measured at high temperatures to lower temperatures reveals that whereas the substitutional impurity is effectively immobile at temperatures below 600° C., interstitial carbon only becomes 'frozen-in' below room temperature.

Clustering (the gathering together of atoms in a non-stoichiometric manner) and subsequent precipitation of mobile carbon can give rise to a number of different chemical phases in silicon, depending on the mechanism via which the impurity is introduced, its concentration and the heat treatment received. Typical phases that might form are:

(a) $\beta$-SiC
(b) $\alpha$-SiC (many polycrystalline types available)
(c) $(C_I)_n$ (graphitic or tetrahedral bonding of interstitial carbon clusters)
(d) $(C_S)_n$ (substitutional carbon clustering)
(e) $(C_S\, Si_I)_n$ (B swirl-type defects).

It has been shown that relatively efficient (0.1%) electroluminescence can be achieved from carbon-rich silicon diodes (UK Patent Application Number 87 11373 GB). However, formation of the above phases due to even higher concentrations of carbon would be detrimental to the efficiency of a very carbon-rich silicon LED, both from the point of view of the electrical quality of the material and the reduction in concentration of the impurity in its required useful state i.e. as isolated substitutional atoms.

H J Stein (Proc 2nd International Conference of Ion Implantation, Garmisch-Partenkirchen 1971 pp2-6) has shown that for SPEG of a $7 \times 10^{15}$ 200 keV C+ cm$^{-2}$ room temperature implant, conventional furnace annealing at 500° C. for 20 minutes resulted in $\sim 50\%$ of the implanted carbon being substitutional. K V Vaidyanathan (Journal of Applied Physics 44 p4583 1973) achieved similar results with 55 keV room temperature implantations. However, after such an anneal, a high concentration of defects will remain in the recrystallised layer. These would act as efficient carrier traps and seriously impair the rectifying properties of a diode fabricated from this material. To remove this residual damage higher anneal temperatures are required, but both workers found that conventional furnace annealing at high temperatures resulted in low levels of substitutionality (e.g. 20% after a 20 minute 800° C. anneal—H J Stein (supra)). Many other workers, e.g. K V Vaidyanathan (supra); J A Borders et al (Applied Physics Letters 18 p509 1971); W Rothemund et al (Journal of Electrochemical Society, 121 p586 1974); I P Akimchenko et al (Radiation Effects 48 p7 1980) and P Durupt et al (Materials Research Society Symposium 23 p747 1984) have identified $\beta$-SiC precipitates in carbon implanted silicon given extended high temperature anneals.

A G Cullis et al (Semiconductor Silicon pp518-525 1981) have demonstrated that LPEG of a $1\times10^{16}$ 40 keV C+cm$^{-2}$ room temperature implant by pulsed laser annealing also results in ~50% of the implanted carbon being substitutional. However, this technique would also be ineffective for producing high quality carbon-rich LEDs for silicon microcircuits because:

(a) there is clear evidence of SiC precipitates,
(b) the implant profile is broadened during LPEG by liquid diffusion and surface segregation (Cullis et al supra) and H Koyama Journal of Applied Physics 51 p3202, 1980),
(c) point defects remain beyond the melt front in LPEG layers (M S Skolnick et al. Applied Physics Letters 38 p464 1981),
(d) this process is not generally VLSI-compatible due to problems with the interface between the molten Si and SiO$_2$ of the device structure.

According to this invention the above problems in producing silicon with negligible precipitate phases of carbon which degrade luminescent efficiency and very high concentrations of substitutional carbon are solved by the use of two-step annealing of carbon ion implanted silicon, where the first annealing step takes place at a low temperature and the second anneal takes place at a high temperature. The preferred method is that of implanting carbon into silicon at about liquid nitrogen temperatures (77K), where the silicon has previously undergone pre-amorphisation and subsequent ion-implantation with at least one isovalent dopant which provides strain compensation for the implanted carbon.

The low and high temperature anneals enable activation of solid phase recrystallisation and damage removal respectively.

The present invention provides a method of producing silicon with about 100% substitutionality of very high concentrations of carbon up to about $10^{21}$ cm$^{-3}$, which has good quality recrystallised layers (single crystal) containing low levels of residual damage. This particular method is compatible with current state-of-the-art VLSI silicon diode processing. By providing a uniformly dispersed solid solution of ~100% substitutional carbon atoms (which are immobile at temperatures below about 600° C.), the presence of the phases caused by clustering and precipitation of mobile carbon can be minimised. Consequently, the reductions of efficiency in carbon-rich silicon LEDs associated with these phases are reduced, and improvements in efficiency due to higher concentrations of the optically active dopant can be realised.

According to this invention a method of incorporating high concentrations of substitutional carbon in silicon comprises the sequential steps of:

implanting a silicon wafer with C+ ions, and
two step annealing of the implanted silicon wafer where a low temperature furnace anneal is followed by a rapid thermal anneal (RTA).

The preferred silicon wafer suitable for carbon ion implantaiton is that which has been pre-implanted by both a pre-amorphising ion and at least one isovalent strain compensating dopant. An alternative method uses a silicon wafer which has not been pre-amorphised but does contain at least one isovalent strain compensating dopant. Low-oxygen silicon such as epitaxial silicon or silicon which is grown by the float zone technique is the preferred type of starting silicon wafer.

The pre-amorphisation implant may be carried out with silicon, although the preferred ions would be one of Germanium (Ge), Tin (Sn) or Lead (Pb). Each would be implanted using a dose of between $1\times10^{14}$ and $1\times10^{16}$ cm$^{-2}$, depending on the ion implantation energy used. Such doses would be used with energies of between 0 and 300 keV for silicon, 0 and 500 keV for germanium, 0 and 750 keV for tin and 0 and 1 MeV for lead.

Each of the implanting steps may take place at any temperature between room temperature (about 300K) and liquid nitrogen temperature (77K). The most convenient temperature to use is room temperature, but implantation at or just above liquid nitrogen temperatures is preferred to minimise dopant clustering and residual damage remaining beyond the original amorphous/crystalline interface after SPEG annealing (F Cembali et al. Solid State Electronics 28 p933 1985).

Strain compensation by implantation of isovalent dopants may be carried out by the use of ions such as Ge+, Sn+ or Pb+. The range of the implanted isovalent dopant must be equal or nearly equal to that of the carbon implant. The strain compensating dopant's maximum concentration must be substantially eight times, 1.74 times and 1.08 times that of the carbon implant maximum concentration for Ge, Sn and Pb respectively.

The carbon implantation of silicon is carried out at energies of between 50 and 500 keV. The C+ implantation dose may be between $1\times10^{13}$ and $5\times10^{16}$ cm$^{+2}$, depending on the implantation energy used.

The furnace anneal is carried out in order to produce solid phase recrystallisation. Further annealing by rapid thermal anneal is carried out to remove residual damage. Both anneals are preferably carried out in an inert atmosphere, such as that provided by the inert gas argon. Solid phase recrystallisation by SPEG anneal may take place in an environment such as an oven at temperatures between 500° C. and 700° C. for times between 30 minutes and 2 hours. RTA takes place at temperatures between 900° C. and 1200° C., for times of between 1 second and 30 seconds.

In order that the invention may be more fully understood, the theoretical basis (with illustrative data) to the invention will now be discussed and aspects thereof will be described by way of example only, both with reference to the accompanying drawings in which.

FIG. 8(c) is a SIMS profile of co-implanted material. All three samples had undergone a 1 hour 650° C. SPEG anneal and a 10 second 1050° C. RTA.

Figure 8:
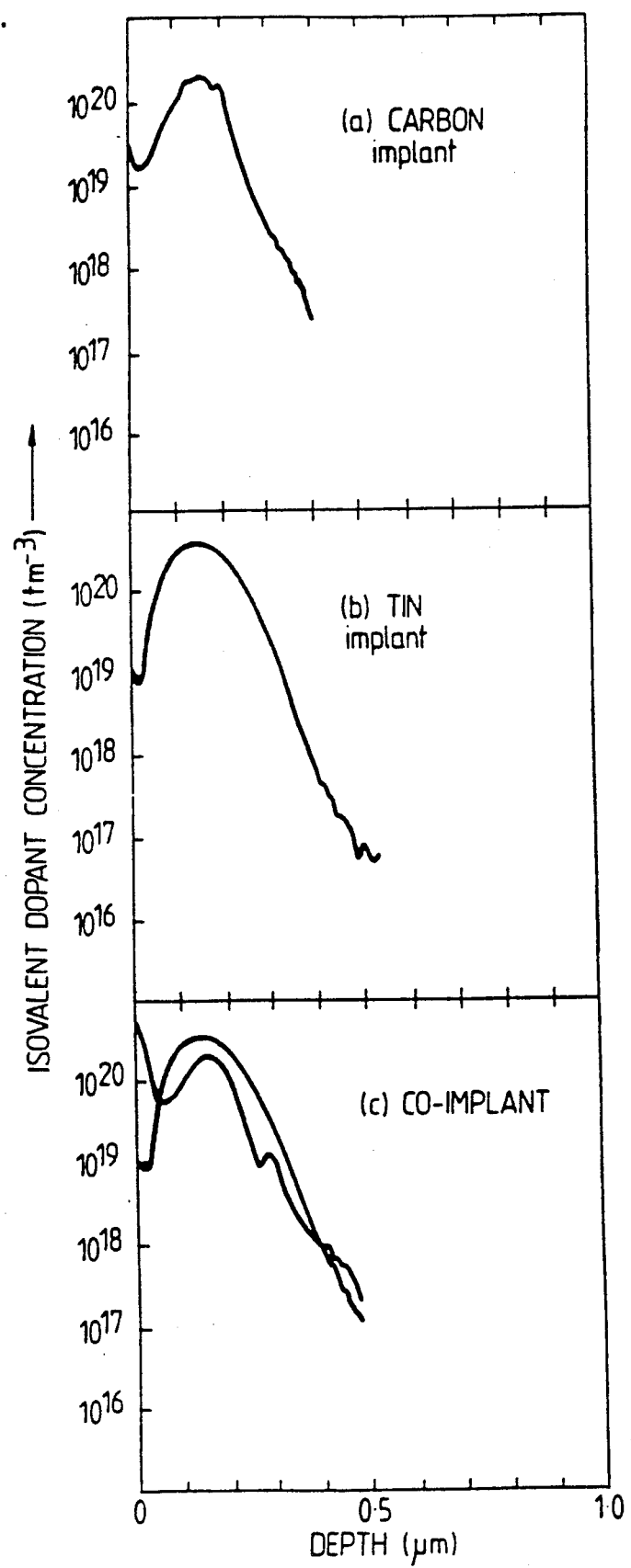
FIG. 8(a) is a SIMS profile of a $2.8 \times 10^{15}$ 55 keV C+ cm$^{-2}$ implant at 77K.
FIG. 8(b) is a SIMS profile of a $5 \times 10^{15}$ 400 keV Sn+ cm$^{-2}$ implant at ~300K.
Figure 9:
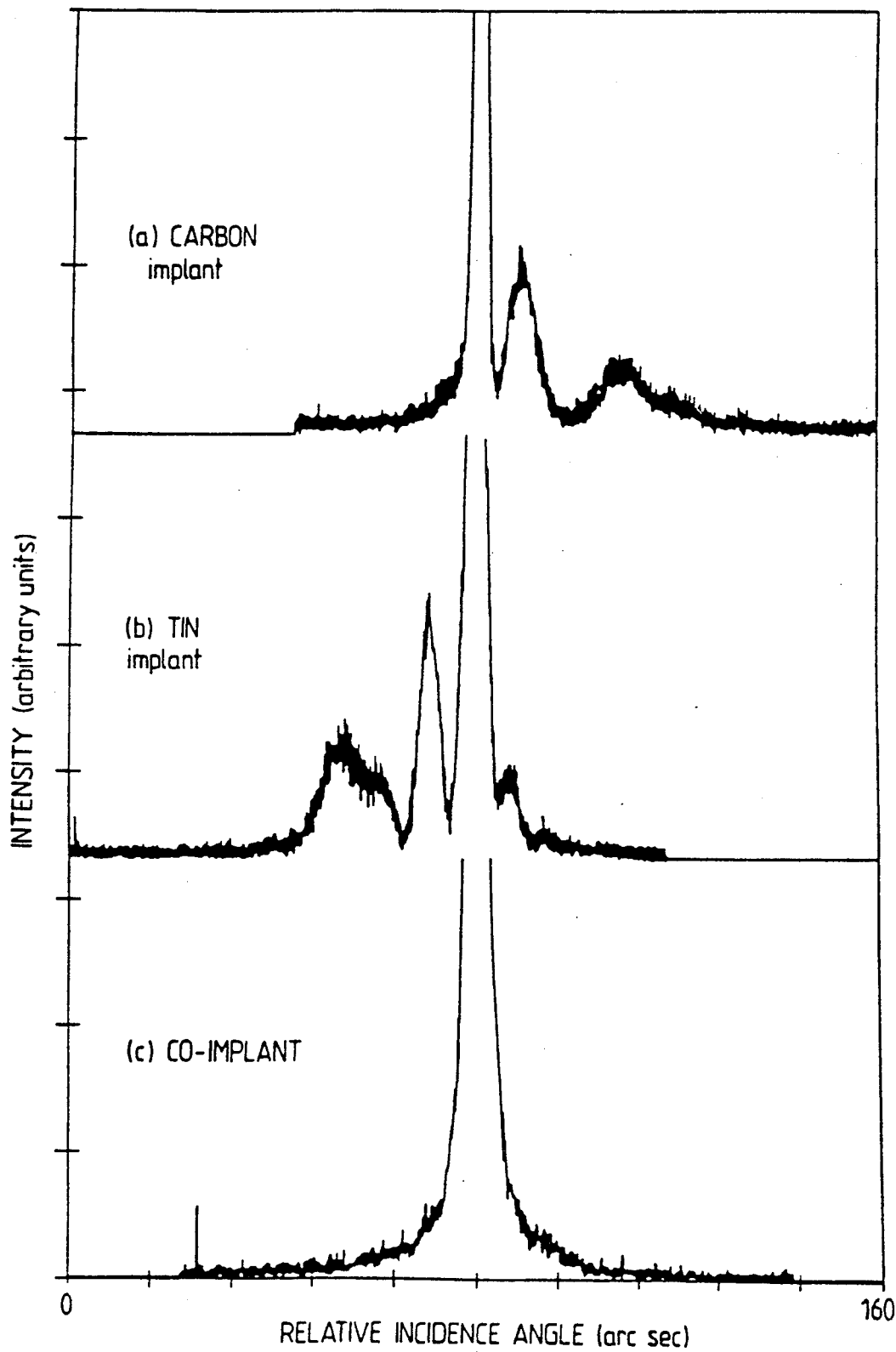

FIG. 9 shows rocking curves where FIGS. 9(a), 9(b) and 9(c) refer to the samples specified in FIGS. 8(a), 8(b) and 8(c) respectively.

Figure 10:
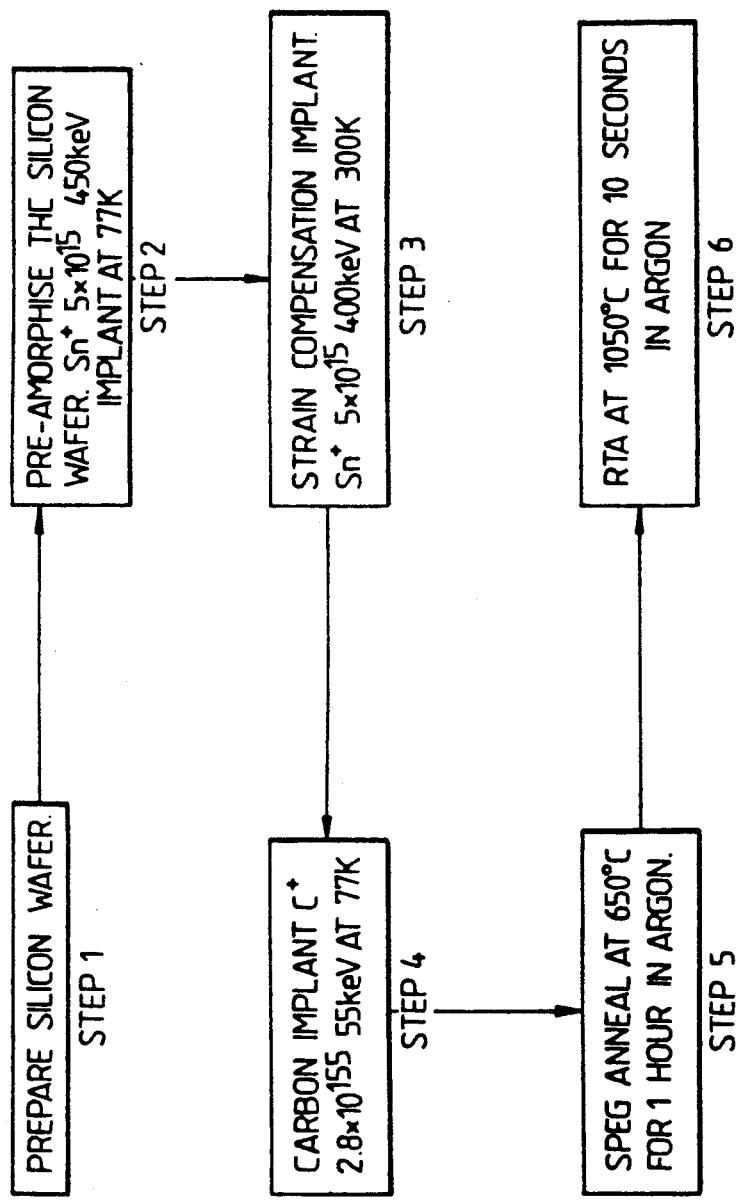

FIG. 10 is a flow diagram of the invention preferred method.

Figure 11:
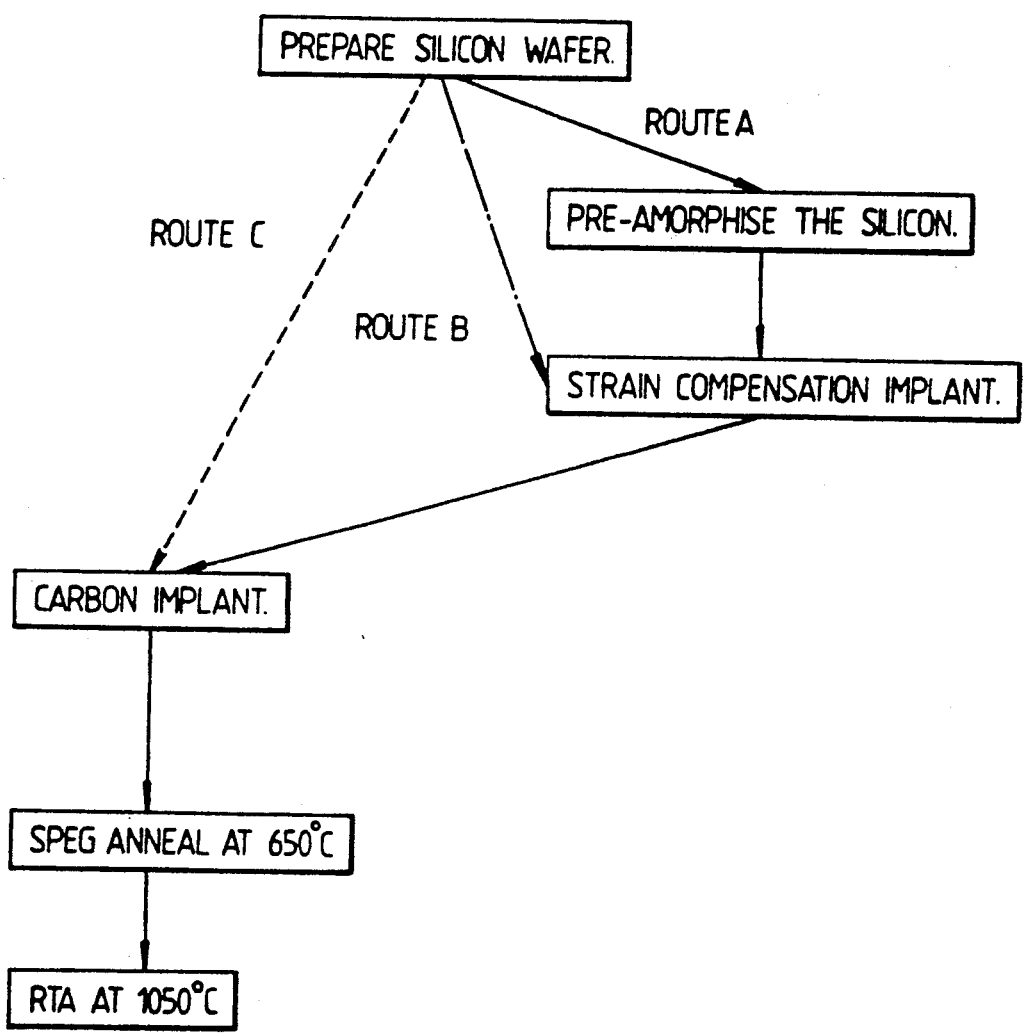

FIG. 11 is a flow diagram of alternative methods.

The first consideration to be taken when discussing the theoretical basis of this invention is that of strain compensation. For N impurity atoms in a matrix of $N_{Si}$ atoms (where N and $N_{Si}$ are referred to unit volume) the solid solubility at temperature T may be expressed by:

$$\frac{N}{N_{Si} - N} = \exp\left(-\frac{\Delta F}{k_B T_N}\right) \quad (2)$$

where $\Delta F$ is the free energy difference between the solution and the matrix, and $k_B$ the Boltzmann constant (P Cappalletti et al, Philosophical Magazine-A 46 p863 1982). The solubility is thus governed by the associated change in free energy $\Delta F$, which can have various contributions.

$$\Delta F = \Delta F_{el} + \Delta F_{vibr} + \Delta F_{pol} + \Delta F_{str} \quad (3)$$

where
- the electronic contribution $\Delta F_{el}$ is associated with the energy required to ionise the impurity;
- the vibrational contribution $\Delta F_{vibr}$ relates to the change in vibrational entropy of the lattice;
- the polarisation contribution $\Delta F_{pol}$ is associated with ordering of the polarisable Si lattice after ionisation of the lattice; and
- the strain contribution $\Delta F_{str}$ refers to the lattice relaxation required to accommodate an impurity of differing size from the host atom.

Carbon, germanium, tin and lead are isovalent with silicon, i.e. they have the same number of electrons in each of their outer electronic shells. Thus, when carbon takes up a substitutional site in silicon it is electrically inactive, and so $\Delta F_{el}$ and $\Delta F_{pol}$ in equation (3) are zero for substitutional carbon. This is also true for substitutional Ge, Sn and Pb. In addition, the vibrational contribution of $\Delta F_{vibr}$, when estimated by the Einstein model of independent oscillators (P Cappalletti et al supra), gives rise to a very small change in free energy (entropy).

Thus, for all 4 isovalent dopants C, Ge, Sn and Pb, their solubility in silicon is dominated by $\Delta F_{str}$, the change in free energy due to strain induced by accommodating the dopant within the Si lattice. Carbon (covalent radius, $r_{cov}=0.77$ Å) is a small atom compared with silicon ($r_{cov}=1.17$ Å) and contracts the silicon lattice when on a substitutional site. In contrast Ge ($r_{cov}=\sim 1.22$ Å), Sn ($r_{cov}=\sim 1.40$ Å) and Pb ($r_{cov}=\sim 1.54$ Å) are all larger atoms than silicon and expand the lattice when substitutional.

Figure 1:
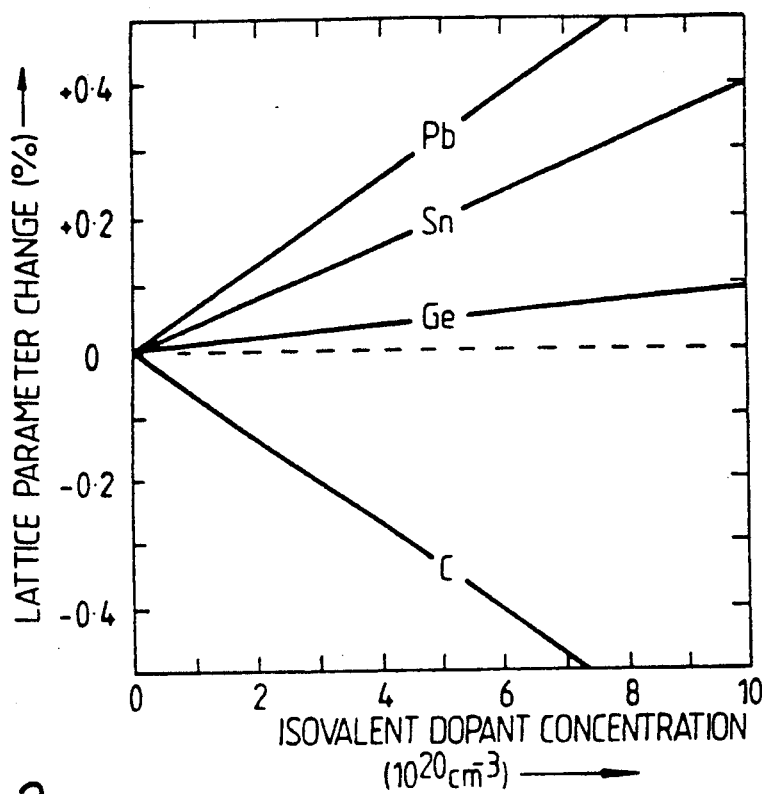
FIG. 1 is a graph of the change in lattice parameter of silicon with isovalent group IV dopant concentration.

Thus, by incorporating at least one of Ge, Sn and Pb which expand the lattice, the contraction due to carbon can be counteracted. By compensating for each other's strain the two or more isovalent impurities should effectively enhance each other's solubility. In order to achieve strain compensation the change in silicon lattice parameter (for a given concentration) arising from the presence of each isovalent dopant alone needs to be known. In the range of purely elastic accommodation the fractional change in lattice parameter $\Delta a_{Si}/a_{Si}$ is linearly proportional to the dopant concentration $N_{dop}$:

$$\frac{\Delta a_{Si}}{a_{Si}} = \beta N_{dop} \quad (4)$$

where $\beta$ is the lattice expansion or contraction coefficient. The value of this coefficient is adequately estimated by the linear model:

$$\beta = \left[\frac{r_{dop}}{r_{Si}} - 1\right] N_{Si}^{-1} \quad (5)$$

where $r_{dop}$ and $r_{Si}$ are the covalent radii of the dopant atoms and silicon atoms respectively, and $N_{Si}$ is the density of lattice sites in silicon. The model predicts that for C, Sn, Ge and Pb respectively:

$\beta_C = -6.84 \times 10^{-24}$ cm$^3$/atom $\beta_{Ge} = +8.55 \times 10^{-25}$ cm$^3$/atom $\beta_{Sn} = +3.93 \times 10^{-24}$ cm$^3$/atom $\beta_{Pb} = +6.32 \times 10^{-24}$ cm$^3$/atom The fractional changes in lattice parameter that would result from very heavy doping with the above impurities are shown in FIG. 1. The theory predicts that for complete compensation of strain in;

Si: Ge,C requires [Ge]~8.0 [C]

Si: Sn,C requires [Sn]~1.74 [C]

Si: Pb,C requires [Pb]~1.08 [C].

In addition to its primary role in stabilising high levels of carbon in the silicon lattice, implantation of Ge, Sn or Pb may also be used to amorphise the silicon layer prior to the implantation of carbon (i.e. to destroy much of the long range order of the silicon whilst retaining a considerable degree of short range order in its nearest-neighbour bonds). It has already been shown that both Ge (D K Sadana et al, Journal of the Electrochemical Society 131, p943 1984) and Sn (F Cembali et al, Solid State Electronics 28 p933, 1985) are useful preamorphisation agents for fabrication of shallow diode structures for VLSI, where implanted boron needs to be retained within a very narrow surface region. In a crystalline lattice there exist major "corridors" along which ions can penetrate deeper ('channel') than when incident in a random direction. Complete amorphisation suppresses this channelling. It also yields better quality regrowth of dopant rich layers since complete annealing of a highly defective crystalline layer is harder to achieve than for an amorphous layer.

As was previously explained, carbon clustering must be minimised at all stages of processing. Low concentration ($10^{12}$–$10^{15}$ cm$^{-2}$) room temperature carbon implants into crystalline silicon give rise to weak G-centre ($C_S$—$Si_I$—$C_S$) luminescence providing unambiguous evidence that carbon pairing occurs during the implantation process itself (C G Kirkpatrick, et al, Radiation Effects 31 p175 1977). Higher order carbon clusters (i.e. with more than two carbon atoms) that are not optically active can also form due to the agglomeration of highly mobile carbon interstitials. Cold (liquid nitrogen) implantation of carbon is thus preferred to room temperature implantation since at that temperature both substitutional and interstitial carbon are frozen into their implanted sites. This should minimise clustering prior to subsequent anneals.

Carbon clustering may also occur during annealing. Prior to SPEG annealing the implanted carbon exists in a tetrahedrally co-ordinated amorphous $Si_{1-x}C_x$ dilute alloy. For a completely random distribution with no chemical ordering, the probability of having $C_S$—$C_S$ nearest neighbour pairs is $4x^2(1-x)^3$, of having $C_S$—$C_S$ next nearest neighbour pairs in $22x^2(1-x)^7$, of having a 3-carbon atom cluster is $6x^3(1-x)^2$ etc. So in a solid solution of $10^{20}$ $C_S$ $cm^{-3}$ (x is therefore $2\times10^{-3}$) there would be $\sim10^{15}$ C—C pairs $cm^{-3}$ and $\sim10^{16}$ next nearest neighbours $cm^{-3}$. The 3-atom cluster concentration would be much lower ($\sim5\times10^{12}$ $cm^{-3}$) and higher order clusters even lower still. Thus prior to SPEG annealing the level of carbon clustering is quite acceptable since it represents a negligible fraction of the implanted dose.

Nucleation of small carbon agglomerates on a much more widespread scale will be initiated during annealing, if the average diffusion length during the anneal cycle is greater than the average separation of carbon atoms i.e. $\sqrt{(D_xt)} > [C]^{-\frac{1}{3}}$ where $\sqrt{(Dt)}$ is the diffusion length. During SPEG annealing carbon clustering within both the amorphous and crystalline phases must be minimised. The diffusivity (D) of carbon in amorphous silicon is not known. However, under equilibrium conditions, the diffusivity of substitutional carbon in crystalline silicon is given by R. C. Newman (Materials Research Society Symposium 59 pp403-417 1986) as:

$$D = 1.9 \exp\left[-\frac{3.1}{kT}\right] cm^2 s^{-1} \quad (6)$$

For a 1 hour SPEG anneal at 600° C. for example $\sqrt{(Dt)} \sim 10$ Å which is less than the average inter-impurity separation for $\sim10^{20}$ atoms $cm^{-3}$. Thus, conventional furnace SPEG annealing at or below 650° C. should not promote gross clustering.

In contrast, at the high temperatures (i.e. >900° C.) needed to remove most residual damage, the diffusivity of substitutional carbon is sufficient to render furnace annealing inadequate to prevent gross clustering. A suitable compromise between damage removal and carbon precipitation can be achieved with RTA (e.g. with results when used on conventional dopants—J. Narayan and C. W. Holland, Journal of Applied Physics 56, p2913, 1984) where high temperatures are only maintained for the order of seconds. Typical temperature ranges of RTA for silicon containing various dopants are $\sim(900°$ C.-1200° C.) for times up to about 30 seconds.

Proof of the theoretical predictions concerning strain compensation and suppression of carbon clustering has been obtained by the experimental results gained by the use of Secondary Ion Mass Spectroscopy (SIMS), to reveal the total carbon content of the implanted layer, mid infrared (IR) absorption and x-ray diffraction rocking curves to determine the fraction of carbon that resides isolated on substitutional sites in annealed material.

Figure 2:
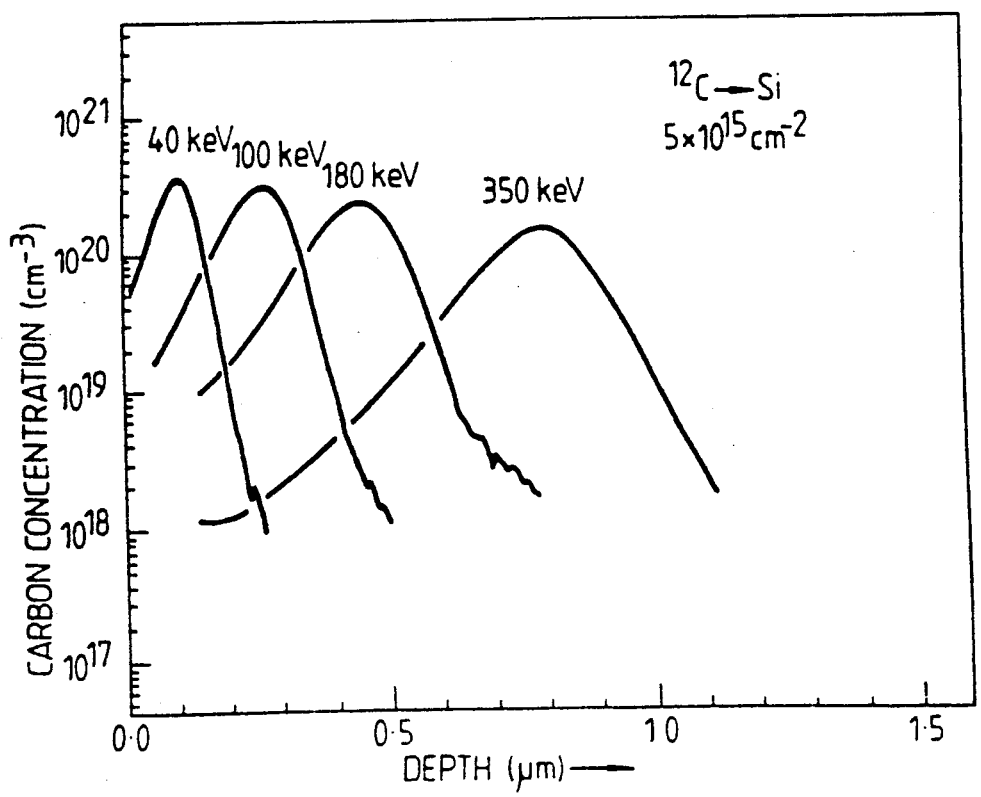
FIG. 2 is a Secondary Ion Mass Spectrometry (SIMS) profile of as-implanted varying-energy C+ implants at a fixed dose ($5\times10^{15}$ cm$^{-2}$).
Figure 3:
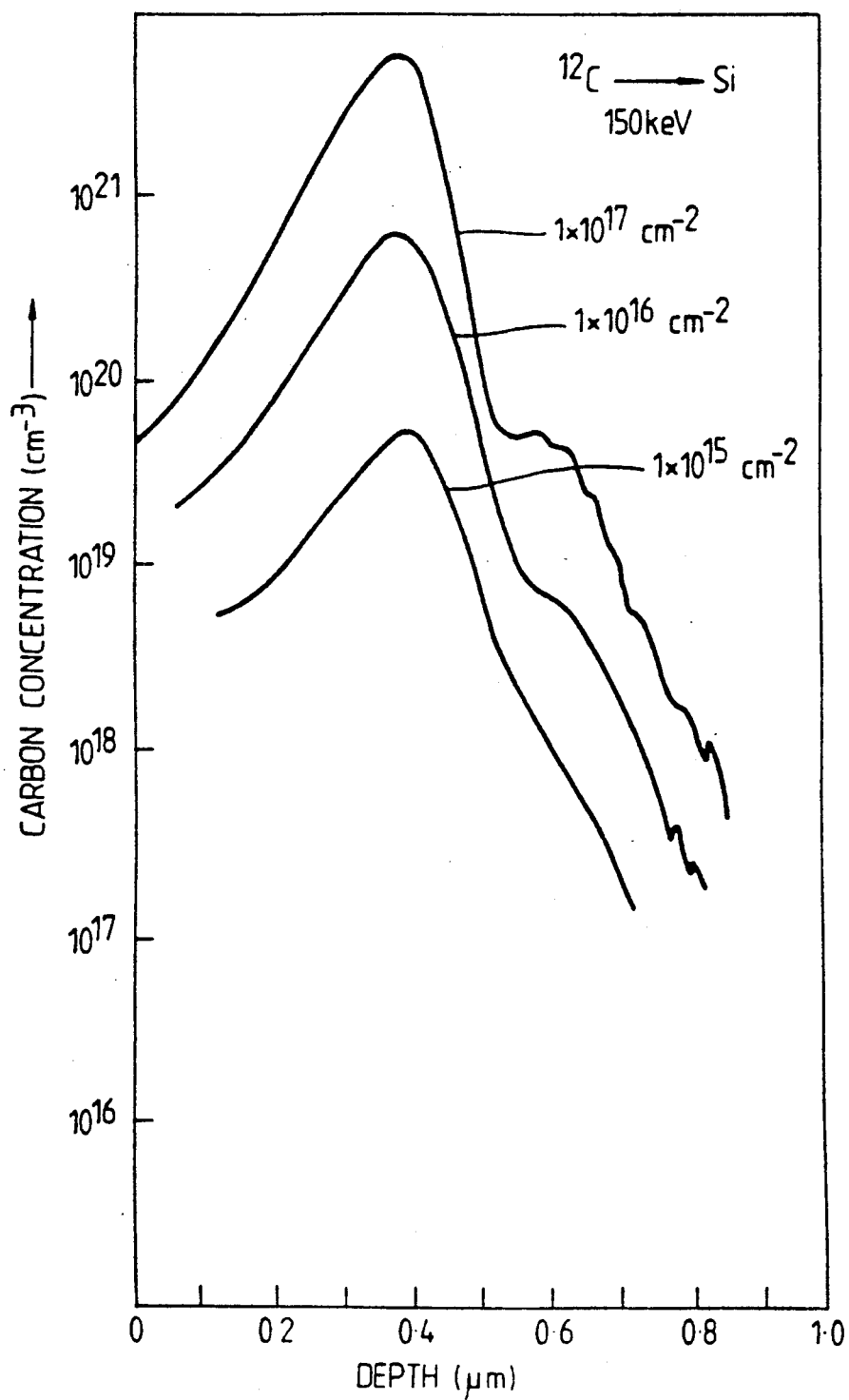
FIG. 3 is a SIMS profile of as-implanted varying dose of C+ implants at a fixed energy (150 keV).

SIMS is used to study the depth distribution of a dopant in a host material. FIGS. 2 and 3 illustrate the typical as-implanted profiles achieved by varying implantation energies and implantation dopant concentrations respectively. As may be seen in FIG. 2, where the implantation energy is increased, this leads to both the peak concentration and the overall distribution occurring at a greater depth in the material. When the implantation energy is kept constant and the implantation dose is increased, then the overall concentration distribution and peak of concentration remain localised at the same depth with substantially the same profile, but the overall concentration increases. This may be seen in FIG. 3.

Canham ('Properties of Silicon', Chapter 12 pp 316-320 Inspec. 1980) has reviewed the data available on IR absorption due to carbon in silicon. Isolated substitutional carbon gives rise to a well-studied localised vibrational mode (LVM) absorption line at 604.9 $cm^{-1}$ (290K). Numerous calibration studies (e.g. J L Regolini et al, Journal of the Electrochemical Society 133 p2165, 1986) have shown that the strength of this absorption line is linearly proportional to the concentration of substitutional carbon, and the current ASTM Standard (Annual Book of ASTM standards (ASTM Philadelphia 1981) procedure F120, pp543-547) gives $$[C_S] = 1.1 \times 10^{17} a_m cm^{-3} \quad (7)$$

where $a_m$ is the peak absorption coefficient measured at room temperature with an instrumental resolution set to give a full width half-height measurement (FWHM) of 7 $cm^{-1}$. In addition precipitated carbon in the form of cubic $\beta$-SiC gives rise to a broadband absorption around 800 $cm^{-1}$, the width and peak position depending on the size and shape of the internal particles.

Figure 4:
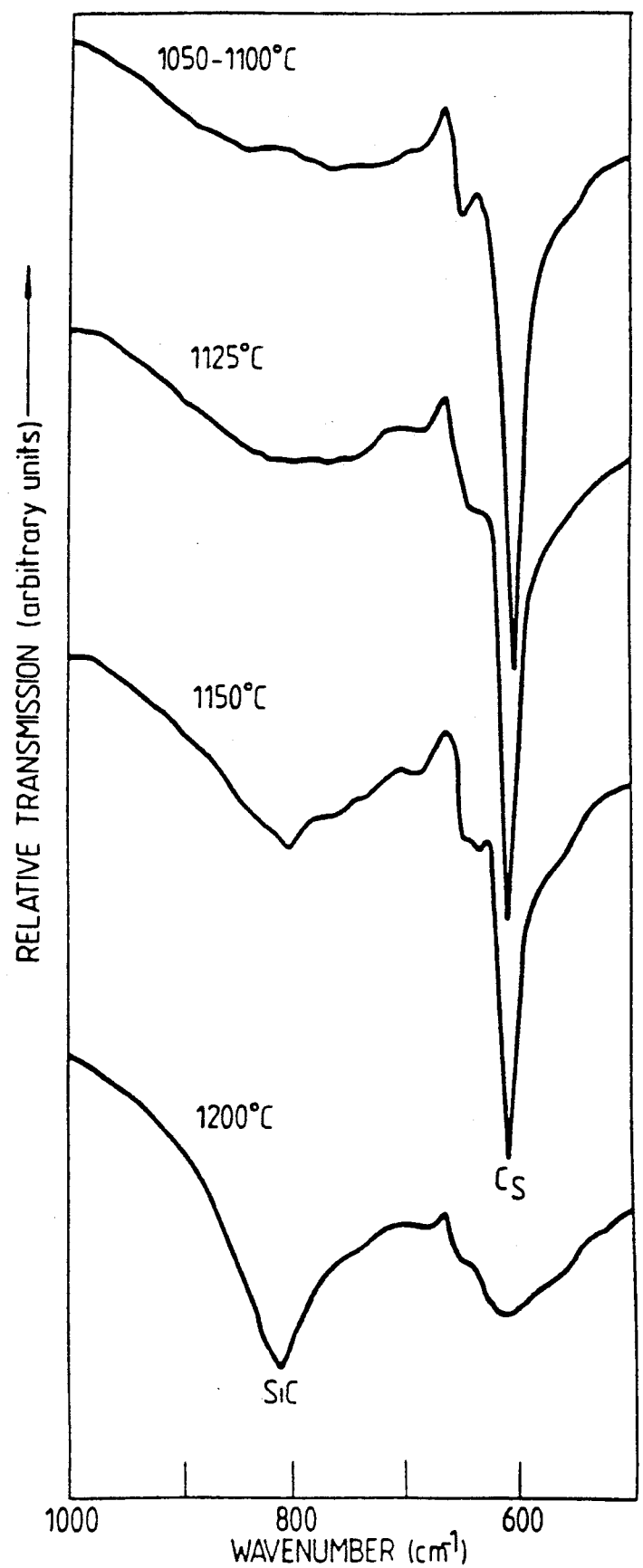
FIG. 4 is an infrared absorption profile of silicon which has been implanted with $7\times10^{15}$ 150 keV C+ cm$^{-2}$ at about 80K. Implantation was followed by a 650° C. 1 hours SPEG and a 10 second RTA at the temperatures shown on the spectrum.

FIG. 4 shows infrared data from a carbon implanted layer that after SPEG annealing at 650° C. is subjected to RTA over a range of temperatures. After a 10 second anneal at 1050° C. the absorption due to substitutional carbon is as strong as after a 650° C. SPEG anneal alone, and from equation (7) corresponds to virtually 100% substitutionality. In addition, no SiC is detected with this technique (the weak absorption around 800 $cm^{-1}$ is due to underlying 2 phonon absorption of the silicon lattice). However, for RTA temperatures of above 1100° C. the strength of the $C_S$ line decreases and absorption characteristic of SiC appears around 800 $cm^{-1}$. For a 1200° C. RTA there is no longer any substitutional carbon detectable.

Rocking curve X-ray diffraction analysis provides a sensitive means of monitoring strain within an ion implanted layer (e.g. M Servidori et al, Journal of Applied Crystallography 21, p176 1988). Diffraction intensity is measured as a function of incidence angle using a highly collimated monochromatic beam of X-rays. The angular position of diffracted peaks is governed by the interplanar lattice spacing via Bragg's law:

$$\lambda = 2d \sin \theta \quad (8)$$

where $\lambda$ is the wavelength of the incident radiation, d is the interplanar spacing and $\theta$ is the angle of incidence.

Figure 5:
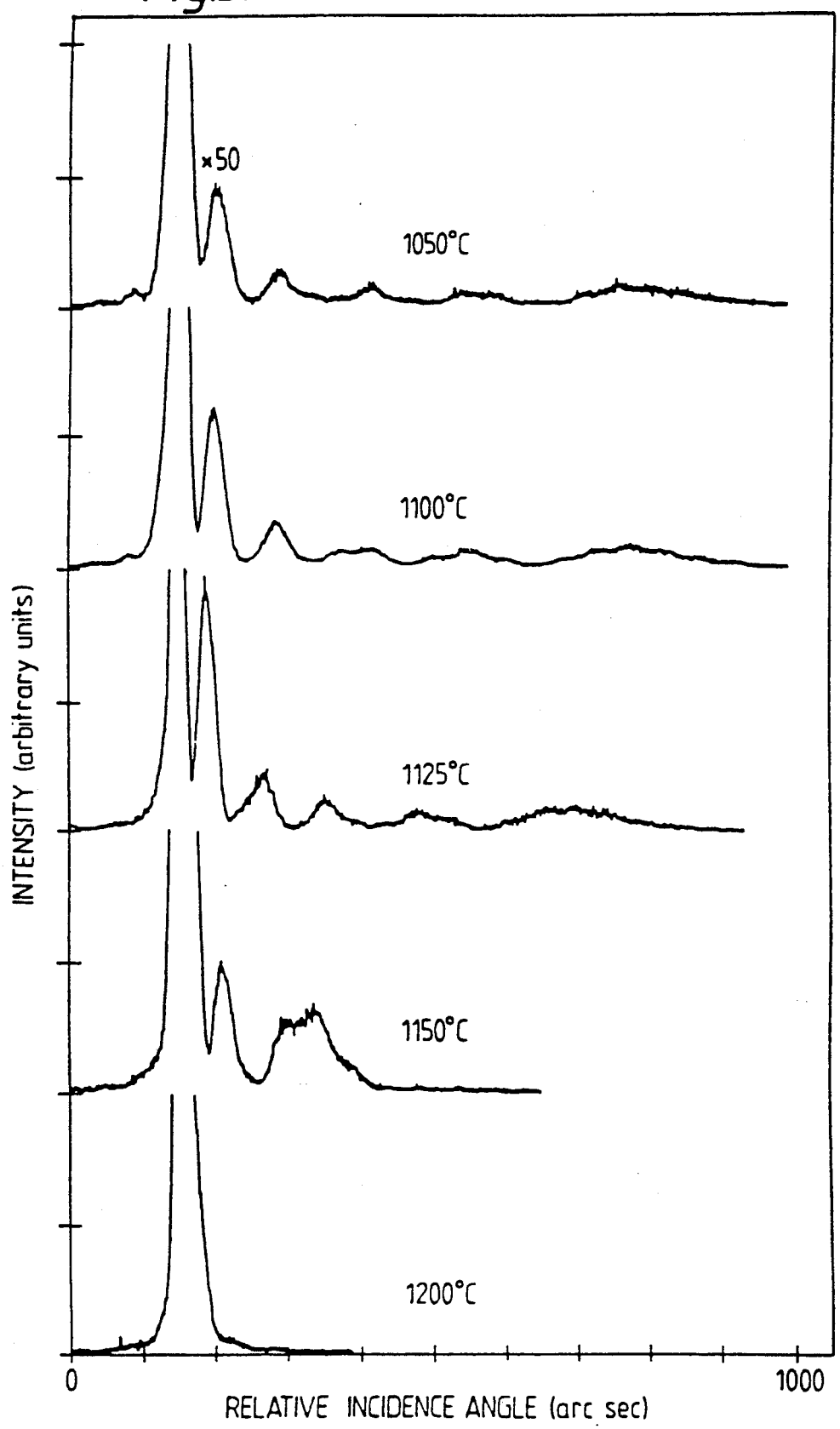
FIG. 5 is an experimental rocking curve of silicon which was processed as described in FIG. 4.

FIG. 5 shows typical rocking curves from the same implanted layer as used for the measurements shown in FIG. 4. A rocking curve profile is achieved by setting up the sample in a position where the incident x-rays are strongly diffracted. The sample is then moved away from this position by rotating about the sample's vertical axis centred from the point at which the x-rays are incident about the sample. The sample is then "rocked" axially through this vertical axis, thus changing the x-ray incidence angle.

In FIG. 5, the most intense peak corresponds to reflection from the underlying unimplanted substrate which is used as the reference point for determining near surface strain. All addition structure in FIG. 5 occurs at greater incidence angles, and hence from equation 8 to negative strain i.e. lattice contraction. A reduction in the angular separation of this structure from the substrate peak corresponds to a reduction in the difference in interplanar spacing between that of the implanted layer and the substrate. As may be seen from FIG. 5, as the RTA temperature is progressively increased, strain within the layers is dramatically reduced.

Comparison of the data shown in FIGS. 4 and 5 correlates the presence of substitutional carbon with measurable lattice contraction and the precipitation of $\beta$ SiC with relief of that strain. The amount of strain induced per carbon atom has been determined by two independent experiments, where the lattice contraction coefficient are both in fair agreement with the value predicted by the linear model of equation (5). Baker et al (Journal of Applied Physics 39, p4365, 1968) and Windisch and Bauer (Philosphical Magazine A 55 p435, 1988) found $\beta$ to be $-6.5 \times 10^{-24}$ cm$^3$ atom$^{-1}$ and $-6.9(0.5) \times 10^{-24}$ cm$^3$ atom$^{-1}$ respectively. Thus the measurement of strain within the layer, when coupled with the known amount of strain induced per carbon atom provides a second means of monitoring substitutionality of the implant.

Figure 6:
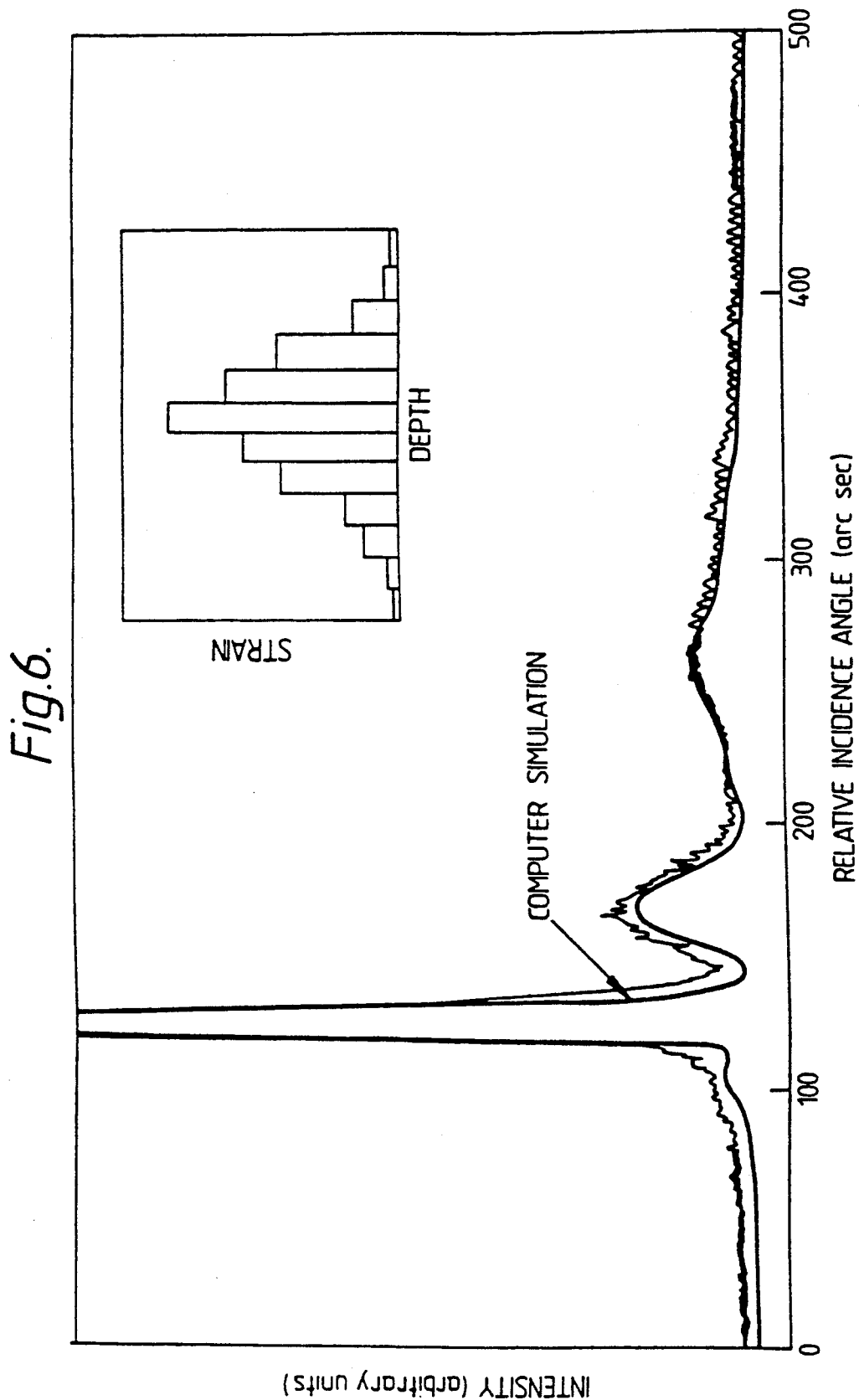
FIG. 6 is an experimental rocking curve from a $2.8\times10^{15}$ 55 keV C+ cm$^{-2}$ implant at 77K after a 1 hour 650° C. SPEG and a 10 second RTA at 1050° C.

FIG. 6 shows an experimental rocking curve of a sample which has been implanted (55 keV C+ at a dose of $2.8 \times 10^{15}$ cm$^{-2}$) and then annealed for 1 hour at 650° C. using SPEG and subsequently by RTA for 10 seconds at 1050° C. The solid line is a computer simulation using the strain profile as seen in the inset. This figure demonstrates that, after certain annealing conditions, an experimental rocking curve can be accurately simulated by a strain depth profile determined from SIMS data. This verifies that the observed lattice contraction can be solely attributed to the presence of the implanted impurity on substitutional sites. The peak strain measured ($\sim 0.29\%$) once again demonstrates that virtually 100% substitutionality may be achieved.

Figure 7:
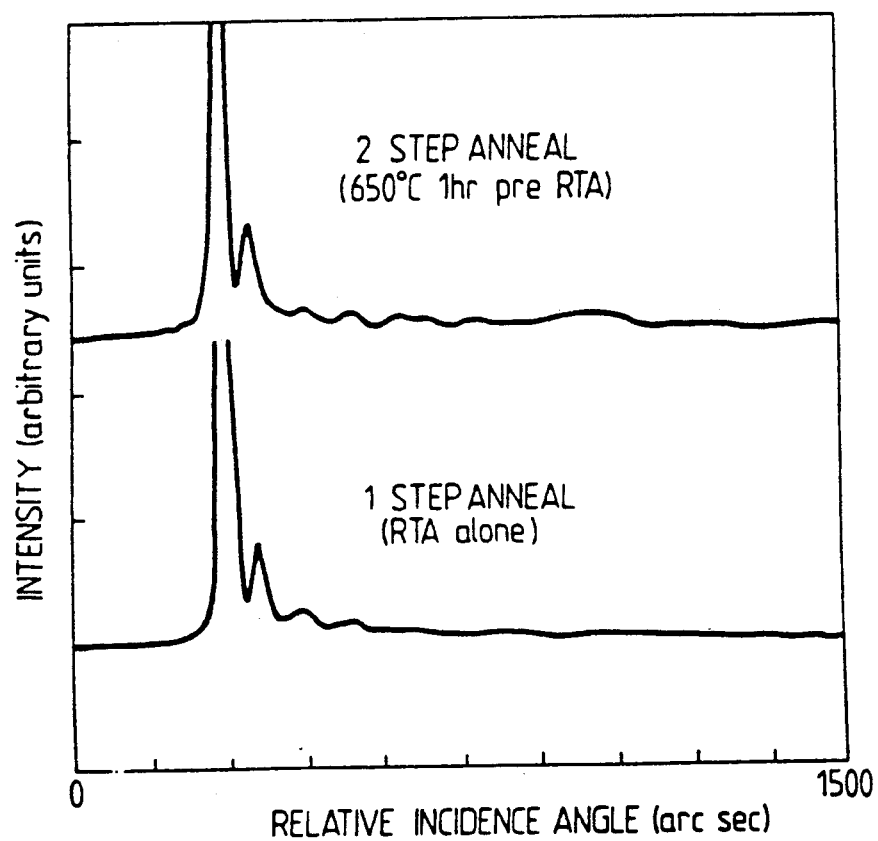
FIG. 7 is an experimental x-ray rocking curve from a $1\times10^{16}$ 150 keV C+ cm$^{-2}$ room temperature (~300K) implant given a 1 step and 2 step anneal.

FIG. 7 shows typical rocking curves from a room temperature C+ implant given different anneals. Although RTA alone results in lattice contraction (and therefore significant substitutionality of carbon) the 2-step anneal results in more strain and therefore less precipitation/clustering of carbon.

FIG. 8 and 9 demonstrate the phenomenon of strain compensation. FIG. 8 shows SIMS profiles of (a) $2.8 \times 10^{15}$ 55 keV C+ cm$^{-2}$ implant carried out at 77K, (b) $5 \times 10^{15}$ 400 keV Sn+ cm$^{-2}$ implant carried out at 300K and (c) double-implanted material where each implant is as specified for FIGS. 8(a) and (b). Each sample was annealed using SPEG at 650° C. for 1 hour followed by RTA at 1050° C. for 10 seconds. The energies and doses of the implants are chosen such that in the double-implanted sample the peak concentration of the implanted tin ($3.5 \times 10^{20}$ cm$^{-3}$) was $\sim 1.7$ times that of the implanted carbon concentration ($2 \times 10^{20}$ cm$^{-3}$) in order to achieve strain compensation.

FIG. 9 shows rocking curves from samples as detailed for FIGS. 8(a), (b) and (c). Here FIGS. 9(a), (b) and (c) correspond to FIGS. 8(a), (b) and (c) respectively. For the double implanted layer the lattice expansion due to tin has compensated for the lattice contraction due to carbon and results in an implanted layer of greatly reduced strain.

FIG. 10 is a flow diagram of the invention method as given by the following specific aspect of the invention. A typical starting wafer would be a 5 microns thick n− epitaxial silicon layer on a n+ Czochralski grown silicon substrate. Germanium is implanted into the silicon at a dose of $5 \times 10^{15}$ cm$^{-2}$ and an energy of 450 keV. This takes place on a liquid nitrogen cooled block ($\sim$77K). The step is termed a pre-amorphisation implant, and results in a maximum germanium concentration of $\sim 2 \times 10^{20}$ cm$^{-3}$ which occurs at a depth of about 0.25 microns. As a result of the pre-amorphisation implant the upper surface of the silicon wafer is amorphous to a depth of about 0.5 microns.

The pre-amorphisation implant is followed by a strain compensation implant of tin at room temperature. The implant is carried out at a dose of $5 \times 10^{15}$ cm$^{-2}$ Sn+ and an energy of 400 keV. Thus results in a maximum tin concentration of about $3.5 \times 10^{20}$ cm$^{-3}$ at a depth of about 0.15 microns.

The carbon implant is then carried out at a dose of $2.8 \times 10^{15}$ cm$^{-2}$ and an energy of 55 keV at a temperature of about 77K. The maximum concentration of carbon is about $2 \times 10^{20}$ at a depth of about 0.15 microns.

Solid phase recystallisation takes place by a SPEG anneal in a furnace at a temperature of 650° C. for 1 hour. The annealing takes place in an inert atmosphere of argon gas. Damage removal is carried out by a rapid thermal anneal (RTA) at 1050° C. for 10 seconds in an argon atmosphere. RTA takes place in an AG Associates Heatpulse 2101 rapid annealer. The wafer is heated in a high purity argon atmosphere within a quartz isolation chamber and is supported by quartz pins. The radiant energy is supplied by banks of 1.5 kW tungsten halogen lamps. The temperature of the implanted wafer surface is ramped up to the required anneal temperature at a rate of 50° C. per second and cooled back down to room temperature at a rate of about 30° C. per second.

Alternative methods to that of FIG. 10 are shown in FIG. 11. The method outlined in FIG. 10 is shown as route A (solid line flow). Route B (intermittent solid line flow) allows for the step of the pre-amorphisation of the silicon wafer to be omitted. Route C (dotted line flow) is carried out by implanting the silicon wafer without either a pre-amorphising or a strain compensating implant.

We claim:
1. A method of incorporating substitutional carbon comprising the sequential steps of:
   implanting a silicon wafer with C+ ions, and
   two step annealing of the implanted silicon wafer comprising first furnace annealing at a temperature within the range 500° C. to 700° C. for a time between about 30 minutes and 2 hours and thereafter annealing at a temperature within the range of 900° C. to 1200° C. for a time between about 1 and 30 seconds.
2. The method of claim 1 further including the step of implanting at least one isovalent dopant for the purpose of strain compensation prior to the implantation by C+ ions.

3. The method of claim 2 further including the step wherein the silicon wafer is implanted with a pre-amorphization ion dopant prior to the subsequent implantations with isovalent dopant and C+.

4. The method of claim 1 where the implanting of the silicon wafer with C+ ions is carried out at a temperature within the range of about 77K to about 300K.

5. The method of claim 2 where the implantation of at least one isovalent dopant is carried out at a temperature within the range of about 77K to 300K.

6. The method of claim 3 where the implantation of a pre-amorphization ion dopant is carried out at a temperature within the range of about 77K to 300K.

7. The method of claim 1 where the implanting of the silicon wafer with C+ ions is carried out at an energy of between 50 keV and 500 keV.

8. The method of claim 1 where implanting of the silicon wafer with C+ is carried out at a C+ dose of between $1 \times 10^{13}$ and $5 \times 10^{16}$ cm$^{-2}$.

9. The method of claim 2 where the isovalent dopant is at least one of Ge+, Sn+ and Pb+.

10. The method of claim 3 where the pre-amorphization ion dopant is one of Si+, Ge+, Sn+ and Pb+.

11. The method of claim 10 where the pre-amorphization implant comprises implantation of Si+ at an energy between 0 and 300 keV.

12. The method of claim 10 where the pre-amorphization implant comprises implantation of Ge+ at an energy between 0 and 500 keV.

13. The method of claim 10 where the pre-amorphization implant comprises implantation of Sn+ at an energy between 0 and 750 keV.

14. The method of claim 10 where the pre-amorphization implant comprises implantation of Pb+ at an energy between 0 and 1 Mev.

15. A silicon wafer containing substitutional carbon made according to the method of claim 1.

* * * * *